United States Patent
Hill

(10) Patent No.: US 10,360,317 B2
(45) Date of Patent: Jul. 23, 2019

(54) BEAM INVERSION BY MONTE CARLO BACK PROJECTION

(71) Applicant: CHEVRON U.S.A. INC., San Ramon, CA (US)

(72) Inventor: N. Ross Hill, Houston, TX (US)

(73) Assignee: Chevron U.S.A. Inc., San Ramon, CA (US)

(*) Notice: Subject to any disclaimer, the term of this patent is extended or adjusted under 35 U.S.C. 154(b) by 978 days.

(21) Appl. No.: 14/200,308

(22) Filed: Mar. 7, 2014

(65) Prior Publication Data

US 2014/0278299 A1    Sep. 18, 2014

Related U.S. Application Data

(60) Provisional application No. 61/788,951, filed on Mar. 15, 2013.

(51) Int. Cl.
*G01V 1/30* (2006.01)
*G06F 17/50* (2006.01)

(52) U.S. Cl.
CPC .......... *G06F 17/5009* (2013.01); *G01V 1/303* (2013.01); *G01V 2210/512* (2013.01); *G01V 2210/66* (2013.01)

(58) Field of Classification Search
CPC ............. G06F 17/5009; G01V 1/303; G01V 2210/66; G01V 2210/512
USPC ........................................ 703/2, 10
See application file for complete search history.

(56) References Cited

U.S. PATENT DOCUMENTS

| 5,274,605 | A | | 12/1993 | Hill | |
|---|---|---|---|---|---|
| 5,508,914 | A | * | 4/1996 | Lee | G01V 1/362 367/68 |
| 5,570,321 | A | * | 10/1996 | Bernitsas | G01V 1/282 367/38 |
| 5,640,368 | A | | 6/1997 | Krebs | |
| 6,246,963 | B1 | * | 6/2001 | Cross | G01V 11/00 702/14 |
| 7,373,252 | B2 | * | 5/2008 | Sherrill | G01V 1/30 702/17 |
| 7,480,206 | B2 | * | 1/2009 | Hill | G01V 1/282 367/38 |
| 8,537,638 | B2 | * | 9/2013 | Lee | G01V 1/368 367/73 |

(Continued)

OTHER PUBLICATIONS

Gaetano Festa and Aldo Zollo, "From data to source parameters: Kinematic modeling", 2012, The Mechanics of Faulting: From Laboratory to Real Earthquakes, 56 pages.*

(Continued)

*Primary Examiner* — Juan C Ochoa
(74) *Attorney, Agent, or Firm* — Esplin & Associates, PC

(57) ABSTRACT

The present invention is directed to a method and system for minimizing artifacts in a seismic image of a subsurface region of interest, wherein the image is determined a data beam set derived from recorded seismic data and a modeled beam set derived at least in part from a velocity model related to a subsurface region. The artifacts, which may result from cycle skipping and coherent noise, result in misalignment of the modeled and data beam sets. The present invention utilizes a Monte Carlo inversion technique to update the velocity model and thus minimize the artifact in the seismic image.

5 Claims, 11 Drawing Sheets

(56) References Cited

U.S. PATENT DOCUMENTS

| | | | | |
|---|---|---|---|---|
| 8,688,381 | B2* | 4/2014 | Routh | G01V 1/282 |
| | | | | 702/2 |
| 8,756,042 | B2* | 6/2014 | Tan | G01V 1/282 |
| | | | | 703/10 |
| 8,923,094 | B2* | 12/2014 | Jing | G01V 1/28 |
| | | | | 367/73 |
| 9,013,956 | B2* | 4/2015 | Hill | G01V 1/282 |
| | | | | 367/73 |
| 2002/0099504 | A1* | 7/2002 | Cross | G01V 11/00 |
| | | | | 702/2 |
| 2003/0216897 | A1* | 11/2003 | Endres | G01V 11/00 |
| | | | | 703/10 |
| 2006/0056272 | A1 | 3/2006 | Hill | |
| 2007/0203673 | A1 | 8/2007 | Sherrill et al. | |
| 2011/0096627 | A1 | 4/2011 | Hill | |
| 2011/0108283 | A1* | 5/2011 | Srnka | G01V 11/00 |
| | | | | 166/369 |
| 2013/0144529 | A1* | 6/2013 | Seydoux | G01V 3/18 |
| | | | | 702/7 |
| 2015/0301222 | A1* | 10/2015 | Davydychev | G01V 3/28 |
| | | | | 324/338 |
| 2016/0116638 | A1* | 4/2016 | Kuchuk | G01V 99/005 |
| | | | | 703/2 |
| 2016/0178798 | A1* | 6/2016 | Holland | E21B 43/26 |
| | | | | 703/2 |

OTHER PUBLICATIONS

Rothman, Nonlinear inversion, statistieal meehanies, and residual staties esiimation Geophysics, vol. 50, No. 12 (Dec. 1985); p. 2784-2796.

Rothman, Automatic estimation of large residual statics corrections Geophysics vol. 51, No. 2 (Feb. 1986); p. 332-346.

Sambridge et al., Monte Carlo Methods in Geophysical Inverse Problems, Reviews of Geophsics, vol. 40, No. 3 (Sep. 2001).

Hill, N. R., Gaussian Beam Migration, Geophysics, vol. 55, pp. 1416-1428 (1990).

Hill, N. R., Prestack Gaussian Beam Migration, Geophysics, vol. 66, pp. 1240-1250 (2001).

Sun, Y. et al., 3-D Prestack Kirchhoff Beam Migration for Depth Imaging, Geophysics, vol. 65, pp. 1592-1603 (2000).

Ribodetti, Joint Ray + Born least-squares migration and simulated annealing optimization for target-oriented quantitative seismic imaging, Geophysics, vol. 76, No. 2 (Apr. 2011).

PCT International Preliminary Report on Patentability, International Application No. PCT/US2014/021545, dated Sep. 15, 2015.

PCT International Search Report and Written Opinion, International Application No. PCT/US2014/021545, dated Jul. 16, 2014.

E. Bonomi, et al., Wavefield Migration plus Monte Carlo Imaging of 3D Prestack Seismic Data, Geophysical Prospecting, 2006, 54, pp. 505-514.

* cited by examiner (A)

(B)

BEAM INVERSION BY MONTE CARLO
BACK PROJECTION

FIELD OF THE INVENTION

The present invention relates generally to methods and systems for seismic imaging and earth modeling, and more particularly, methods which minimize the effects of cycle-skipping and spurious alignments with coherent noise that degrade performance of previously disclosed travel-time reflection tomography methods.

BACKGROUND OF THE INVENTION

Beam tomography as described for example in U.S. Pat. No. 9,013,956 ("the '956 Patent") improves estimations of seismic velocities by finding velocity corrections that improve the alignment of beams with a seismic image. The beam tomography method described in the '956 Patent includes a step of determining velocity model corrections that improve a match between beams formed by locally steering recorded data and beams formed by modeling the recorded beams using the current velocity model and current image. As such, velocity model updates can be obtained by minimizing the difference between recorded data and synthetic data formed by forward modeling computations.

The '956 Patent describes a so-called maximum-correlation shift method (MCS), which includes the step of cross-correlating data and modeled beams to determine the quantitative match between pairs of data and modeled beam. Each of the beam pairs corresponds to a single ray path through the earth. The complete ray path has a segment beginning at a seismic source and another segment terminating at a receiver. The beams are functions of travel time along their associated ray path. The two beams in a pair are cross-correlated over a range of travel time shifts. The time shift that maximizes the cross-correlation of each beam pair is captured and used as a data value for the tomography. This matching by cross correlation is done for many raypaths, typically on the order of $10^7$ for the current applications.

Next, the velocities along each raypath must be changed to fit the time shift measured between the data and modeled beam. Each raypath and corresponding time shift generates an equation that linearly relates the velocities changes along the raypath to the measured travel time shift. For MCS implementations of beam tomography, this large, sparse system of equations is solved by an iteratively reweighted least squares inversion of a large, sparse matrix. The input data for the MCS method are alignment shifts with a single shift value represents the proper alignment of each pair of modeled and data beams. The success of the MCS implementation depends on the cross correlations providing good measurements of the misalignments between beam pairs. Unfortunately these measurements can be degraded by cycle skips, which cause the cross-correlations to misrepresent the correct alignments.

To some degree, cycle skips can be tolerated by driving the reweighted least-squares solution toward an L1 norm, which better handles the data outliers caused by cycle skips. This reweighting process, however, can only handle a small degree of cycle skipping, which means that the data must have low levels of noise.

An example of the cycle skipping problem is shown in FIGS. 1A and 1B. FIGS. 1A and 1B shows pairs of data and modeled beams: the dark traces are beams computed by localized slant stacking of the recorded data, and light traces are computed by modeling computations using the an earth model to describe the subsurface velocity structure and a seismic image to describe the subsurface reflectors. The light and dark traces are shown in pairs, such that each pair corresponds to a ray path through the earth. FIG. 1A shows the unaligned traces, and FIG. 1B shows the traces after alignment. Note, the horizontal lines through the middle of FIGS. 1A and 1B are timing lines corresponding to ray trace arrival times.

With reference to FIG. 1A, the two traces in each pair have some amount of misalignment, which is caused by errors in the earth model and image. The proper alignment of most traces is unambiguous and can easily be measured by finding the cross-correlation maximum. In FIG. 1B, the traces are aligned by shifting them to obtain maximum cross correlations—between light and dark traces. The line at the top of FIG. 1B ("Shifts") shows the time shifts needed to maximize the cross correlations. Note, however, the mid offsets near the middle of FIG. 1B. Here, rapid variations in time shifts are used to align the traces. These rapid variations are caused by cycle skips, for which the maximum cross-correlation alignment differs from the correct alignment by one or more cycles of the waveform. As such, it is not clear from the data alone which of the local maximum in the cross-correlation function corresponds to the correct alignment. The global maximum may not be correct due to noise or numerical approximation.

Additionally, in cases where the data contain strong coherent noise caused by multiple reflections, such as in FIG. 2A, the traces can be shifted to form an apparently well aligned event as shown near the center of FIG. 2B. However, it might be that the cross-correlation maximum does not correspond to the proper trace alignment. Although there appears to be convincing alignment of the events near the middle of FIG. 2B, the extreme irregularity of the time shifts plotted at the top of this panel suggests the presence of a spurious alignment caused by the coherent noise.

As such, a problem with the previously disclosed MCS method is that the step of measuring the time shifts between beams of a beam pair is independent from the step of inverting for the velocity corrections in the earth model. Alignments performed solely by finding maximum cross-correlations are prone to cycle skips because there is no discrimination based on whether a shift corresponds to a reasonable change in velocity and whether this shift is in accord with the shifts measured between other beams pairs. Measured shifts are fixed and are subsequently used in a linear inversion for velocity. This linear inversion has no provision for correcting outlier measurements that are caused by cycle skips or for discarding shifts that are spurious alignments with coherent noise.

As such, a need exists for a travel-time reflection tomography method that is less susceptible to the effects of cycle skipping and a spurious alignment with coherent noise.

SUMMARY OF THE INVENTION

A computer-implemented method is provided for minimizing artifacts in a seismic image of a subsurface region of interest, the image based on a data beam set derived from recorded seismic data and a modeled beam set derived at least in part from a velocity model related to a subsurface region. The method includes the steps of determining a cross-correlation function between the modeled beam set and data beam set over a predetermined range of time shifts; using the cross-correlation function to determine a probability distribution function of over the predetermined range of time shifts; using the probability distribution function to determine a cumulative distribution function over the predetermined range of time shifts; generating a random number within a predetermined interval; selecting a time shift value from the predetermined range of time shifts such that the randomly generated number is equal to the cumulative distribution function; and using the time shift value to compute a velocity correction for the velocity model.

As such, the present invention is a Monte Carlo method that minimizes the effects of certain artifacts, such as cycle skipping in the beam alignments and spurious alignments due to coherent noise. The method combines simulated annealing Monte Carlo techniques, which have been previously used for reflection statics (Rothman, 1985, 1986) and more general velocity model inversions (Sambridge, et al., 2002), with back projection techniques. That is, the method combines a Monte Carlo probabilistic choice of shift values with the iterations of a back projection velocity inversion technique. The combination can produce velocity estimations in settings where correct cycle alignment cannot be done solely by cross correlations and where coherent noise causes spurious alignments.

BRIEF DESCRIPTION OF THE DRAWINGS

A detailed description of the present invention is made with reference to specific embodiments thereof as illustrated in the appended drawings. The drawings depict only typical embodiments of the invention and therefore are not to be considered to be limiting of its scope

FIGS. 10A and 10, receptively, are graphical representations of: (A) a probability distribution function corresponding to Equation (2) with a large value of $\Theta$; and (B) a probability distribution function corresponding to Equation (2) with a small value of $\Theta$.

DETAILED DESCRIPTION OF THE INVENTION

Figure 1:
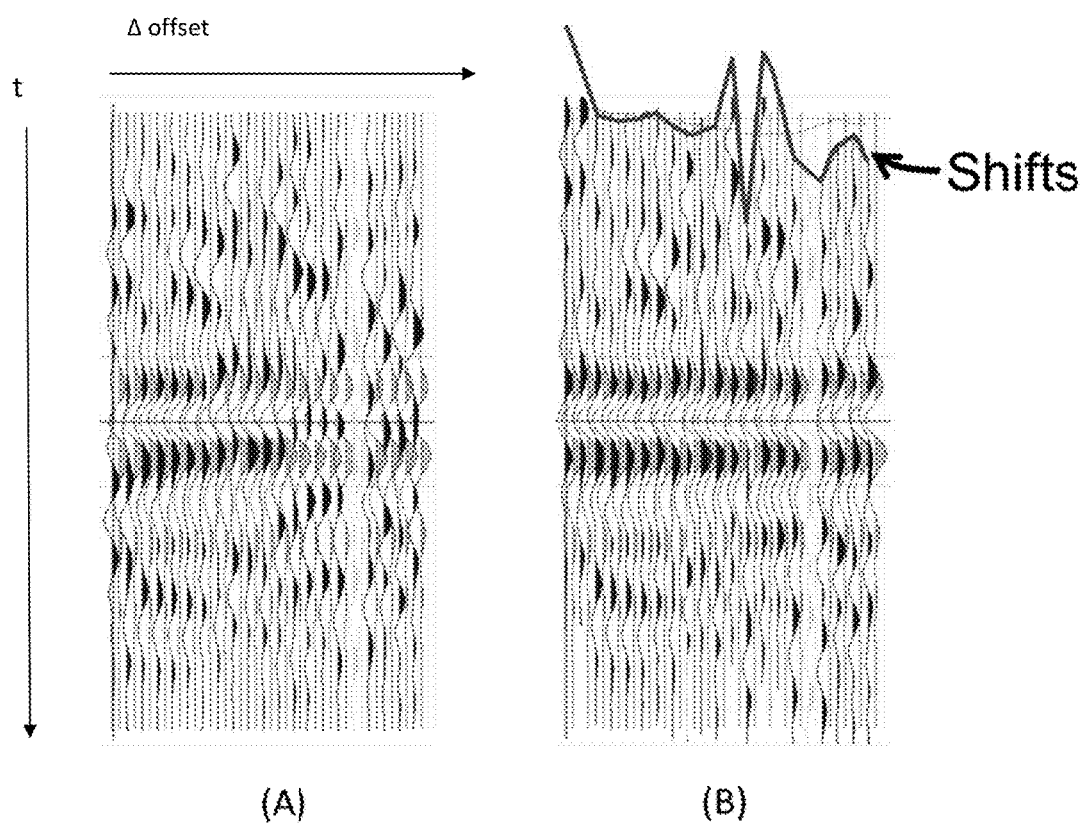
FIGS. 1A and 1B are diagrams showing misalignment of seismic data traces and modeled beams corresponding to a first location.
Figure 2:
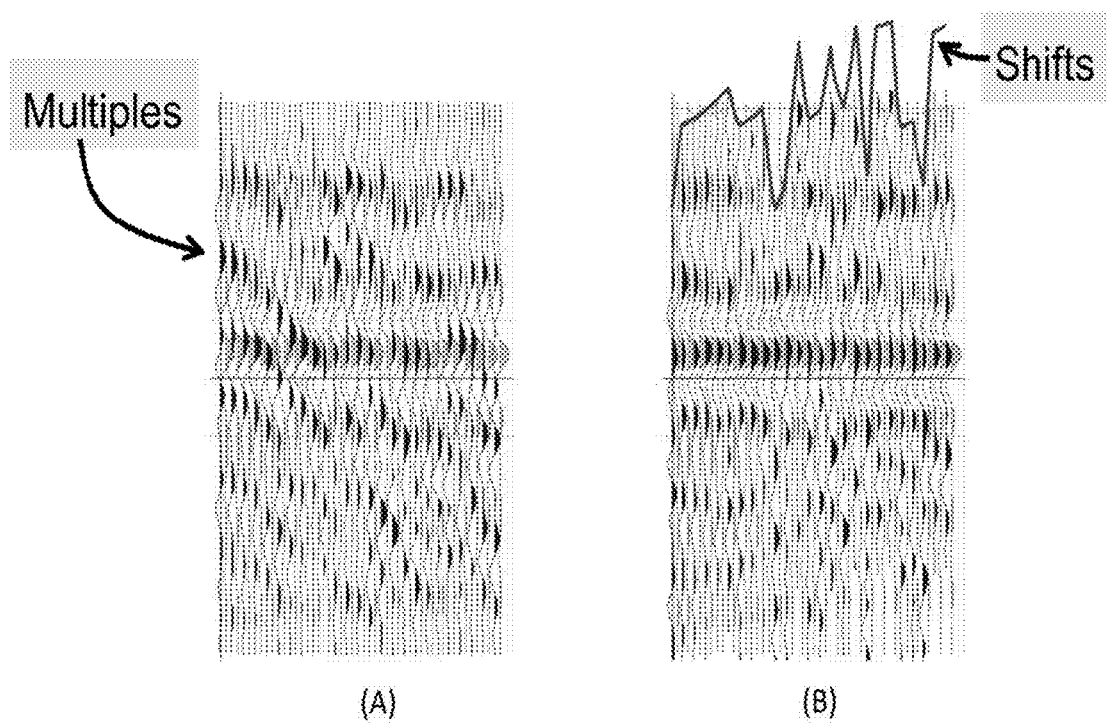
FIGS. 2A and 2B are diagrams showing misalignment of seismic data traces and modeled beams corresponding to a second location.

The present invention may be described and implemented in the general context of a system and computer methods to be executed by a computer. Such computer-executable instructions may include programs, routines, objects, components, data structures, and computer software technologies that can be used to perform particular tasks and process abstract data types. Software implementations of the present invention may be coded in different languages for application in a variety of computing platforms and environments. It will be appreciated that the scope and underlying principles of the present invention are not limited to any particular computer software technology.

Moreover, those skilled in the art will appreciate that the present invention may be practiced using any one or combination of hardware and software configurations, including but not limited to a system having single and/or multi-processer computer processors system, hand-held devices, programmable consumer electronics, mini-computers, mainframe computers, supercomputers, and the like. The invention may also be practiced in distributed computing environments where tasks are performed by servers or other processing devices that are linked through one or more data communications networks. In a distributed computing environment, program modules may be located in both local and remote computer storage media including memory storage devices.

Also, an article of manufacture for use with a computer processor, such as a CD, pre-recorded disk or other equivalent devices, may include a computer program storage medium and program means recorded thereon for directing the computer processor to facilitate the implementation and practice of the present invention. Such devices and articles of manufacture also fall within the spirit and scope of the present invention.

Referring now to the drawings, embodiments of the present invention will be described. The invention can be implemented in numerous ways, including for example as a system (including a computer processing system), a method (including a computer implemented method), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore are not to be considered limiting of its scope and breadth.

Figure 3:
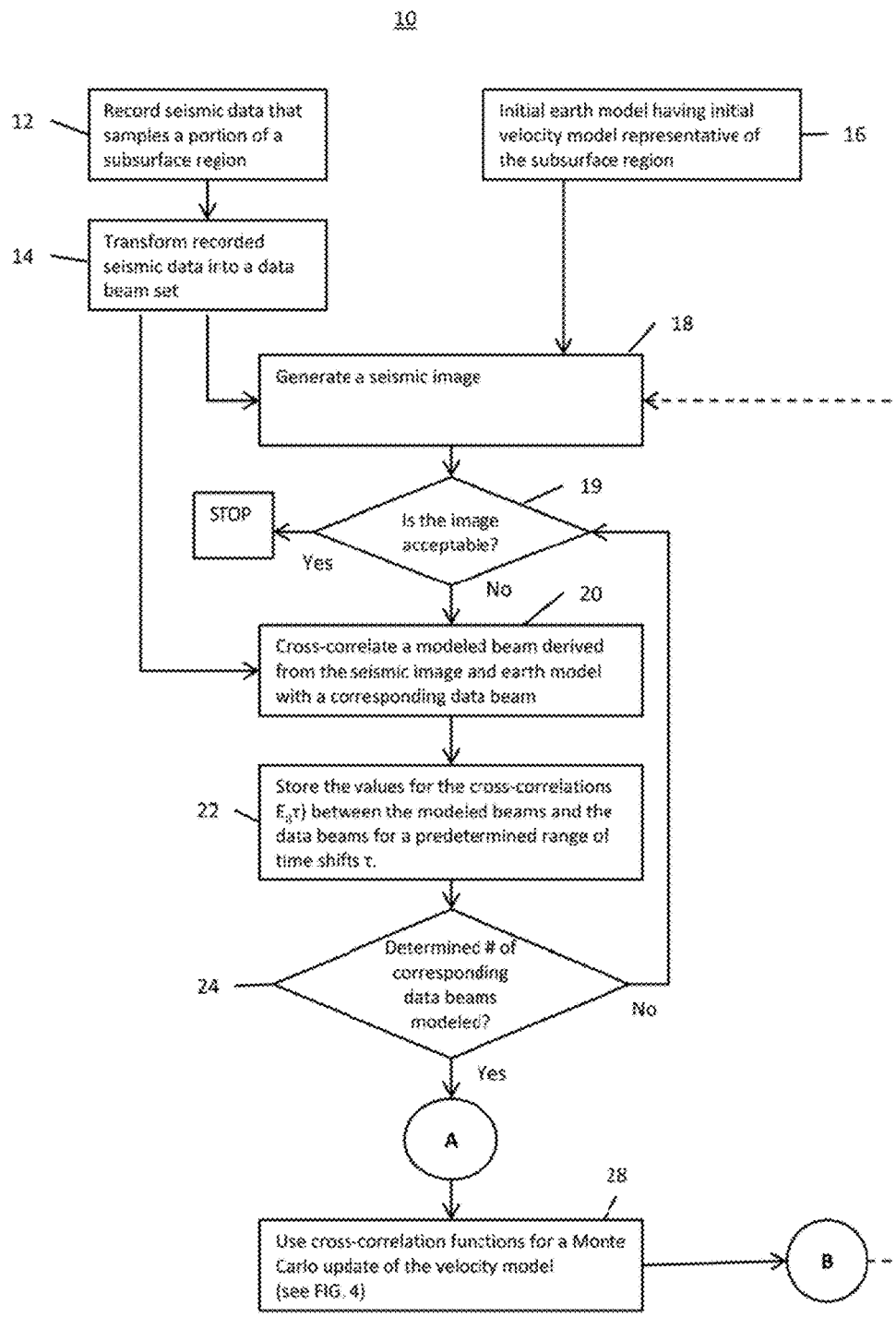
FIG. 3 is a flow chart showing a beam aligment method in accordance with an embodiment of the present invention.
Figure 4:
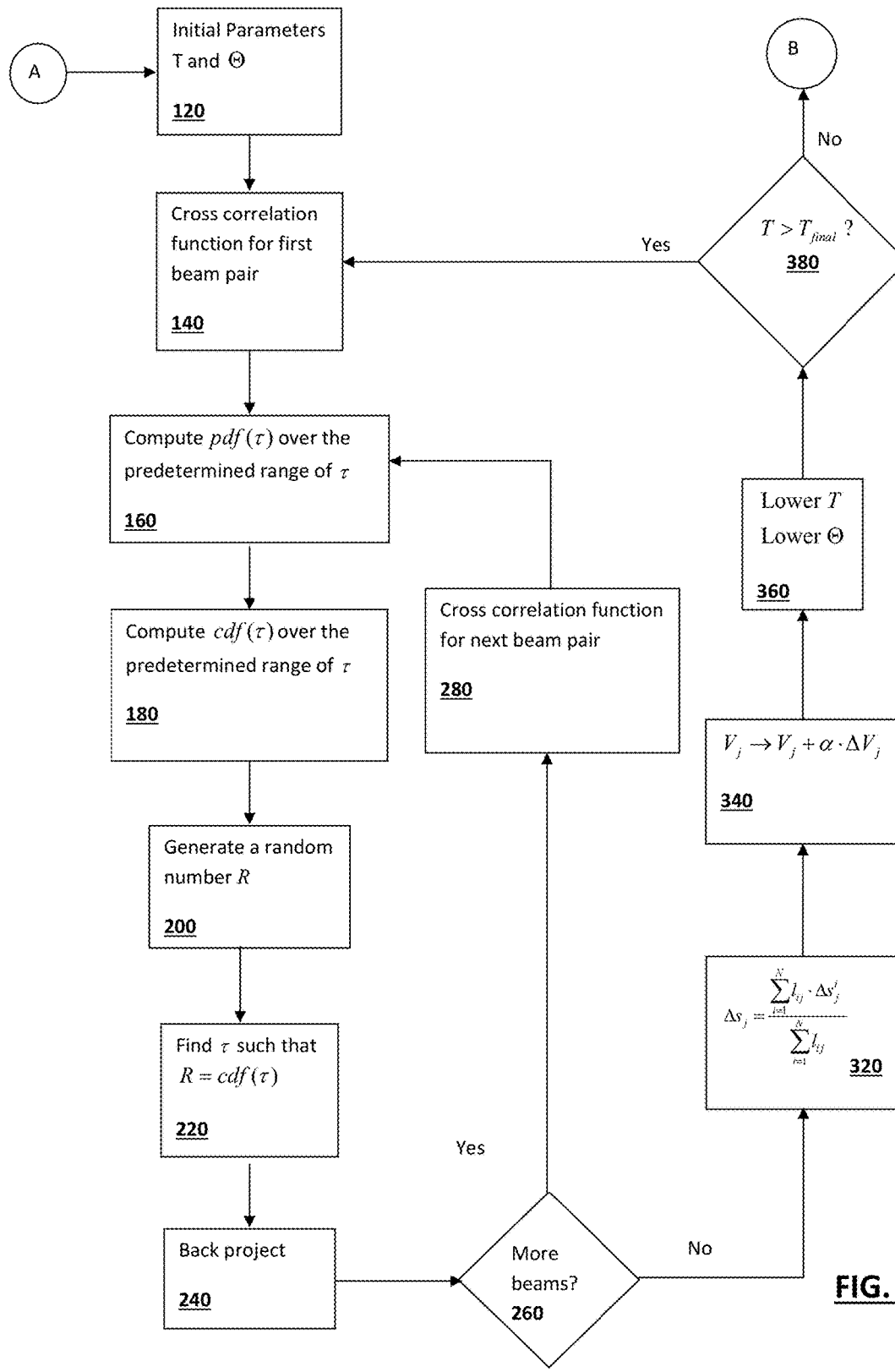
FIG. 4 is a flow chart showing a Monte Carlo inversion method in accordance with an embodiment of the present invention.

FIG. 3 is an flow chart of a computer-implemented beam alignment method 10 that utilizes a Monte Carlo update of a velocity model in accordance with the present invention. FIG. 3 shows a method which is similar to the MCS invention described in U.S. Pat. No. 9,013,956, which is incorporated herein in its entirety. The method 10 can be used for refining a seismic velocity model and generating seismic images related to a subsurface region of the earth, in accordance with one or more embodiments of the operations of method 10 presented below are intended to be illustrative. In some embodiments, method 10 may be accomplished with one or more additional operations not described, and/or without one or more of the operations discussed. Additionally, the order in which the operations of method 10 are illustrated in FIGS. 3 and 4 and described below is not intended to be limiting.

In one embodiment, the method 10 includes the step of accessing recorded seismic data, step 12, and transforming the recorded seismic to form a data beam set 14. The data beam set can be stored in a computer storage media. Typically, the recorded seismic data samples have undergone preliminary processing to increase the signal-to-noise ratio and condition these data for subsequent imaging processes. In some embodiments, beam-formation transformation as described for example in Hill, N. R., Gaussian Beam Migration, Geophysics, Volume 55, pp. 1416-28 (1990) and Hill, N. R., Prestack Gaussian Beam Migration, Geophysics, Volume 66, pp. 1240-50 (2001), can be used for the beam-formation transform operation, however, those skilled in the art will appreciate that other methods can be used, such as such as the beam method described by Sun, Y. et al., 3-D Prestack Kirchhoff Beam Migration for Depth Imaging, Geophysics, Volume 65, pp. 1592-1603 (2000).

An initial earth model 16 and data beam set 14 are then input to a migration, step 18, which forms a seismic image of the subsurface region. The initial earth model 16 typically has been constructed by geological interpretation and geophysical analysis. For example, it may contain a model of a salt mass, which was constructed by extensive geological interpretation of existing seismic images, and the subsurface velocity model may have been determined by any number of tomographic methods known to those skilled in the art.

After the image is generated in step 18, it is decided in step 19 if this imaging will be followed by an update of the velocity model. A reason for not doing an update includes a judgment that the image generated at step 18 is satisfactory, for example, due to the image being consistent with geologic or other information known about the subsurface volume of interest. Another reason for not doing an update would be that the previous iteration made no significant update to the velocity model.

Figure 5:
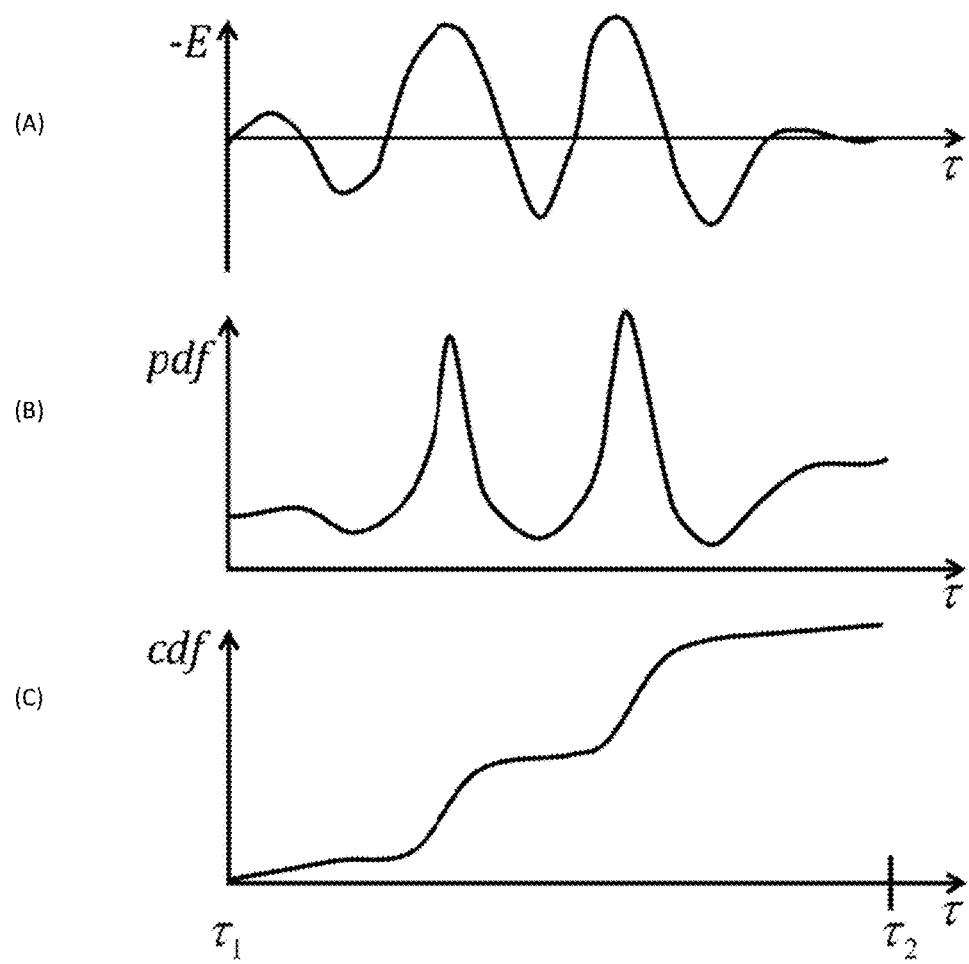
FIGS. 5A-C, respectively, are graphical representations of: (A) a crosscorrelation function (as a function of time shift ($\tau$)) corresponding to Equation (1); (B) a probability distribution function corresponding to Equation (2); and (C) a cummulative distribution function corresponding to Equation (3).

At step 20, a modeled beam (hereinafter called "model beam(s)", "modeled beam(s)" or "model beam set"), derived from the seismic image and earth model as described for example in U.S. Pat. No. 9,013,956, is cross-correlated with a corresponding data beam over a range of time shifts between the modeled beam and data beam. In step 20, a cross-correlation function $E_i(\tau)$ for the $i^{th}$ beam pair as a function of time shift z is defined as follows in Equation 1:

$$E_i(\tau) = \int_{T_1}^{T_2} u_i^d(t) u_i^m(t+\tau) dt, \quad \text{Equation (1)}$$

where $u_i^m(t)$ is the modeled beam and $u_i^d(t)$ is the data beam for the $i^{th}$ ray. The models and data beams, $u_i^m(t)$ and $u_i^d(t)$, can be computed for example by the method described in U.S. Pat. No. 9,013,956. The integration interval $[T_1, T_2]$ extends over a predetermined time window that is centered about a time delay computed by ray-path travel times. This delay time is usually selected to be the travel time along the source ray segment from the source point to the point on the segment nearest to the receiver ray segment plus the travel time along the receiver ray segment from the receiver to the point on the receiver segment nearest to the source ray segment. An exemplary cross-correlation function is shown in FIG. 5a. (See discussion below for step 140.) The cross-correlations can then be stored in step 22 for a predetermined range of time shifts.

Referring back to FIG. 3, once it is determined step 24 that there are no more beams to be modeled, in some embodiments, the method of the present invention proceeds to the inversion operation of step 28, which is described below with reference to FIG. 4. The inversion operation 28 attempts to find corrections to the velocity model that will correct the residual misalignments between the modeled beams and the data beams. Each of the modeled beams is associated with a ray path that has two segments. One segment represents propagation of the source wavefield (hereinafter "source ray segment"), and another segment represents propagation of the receiver wavefield (hereinafter "receiver ray segment"). The two ray segments do not necessarily intersect. These two ray segments are determined by their associated beam component of the recorded seismic data and the earth model velocity; they do not depend on any model of reflector structure. These ray paths pass through cells in a grid of velocity model corrections. The velocities in all of the cells are adjusted to model the measured time shifts between the modeled beams and data beams. This modeling generates an equation for every beam pair stored at operation 22. The integral of the slowness correction along the source ray and the receiver ray should be equal to the time shift necessary to align the modeled beams and data beams. Slowness is defined as the reciprocal of velocity. The updated velocity model from step 28 (circle B on FIGS. 3 and 4) is then provided to the image update step, step 18.

Note, for the first iteration of method 10, steps 18 through 24 operate in the sequence shown in FIG. 3. For successive iterations, steps 18 through 24 operate between steps 340 and 360 of FIG. 4, which is described below.

FIG. 4 show a flow chart of the Monte Carlo inversion method (step 28 of FIG. 3) in accordance with the present invention. In accordance with the method, measured time-shift data are inverted for velocity model corrections. The input data to the Monte Carlo inversion are initial parameter values (step 120) and cross-correlation between pairs of model and data beams, which were determined at step 22 in the flowchart (FIG. 3). The most important parameters are temperature T and time interval $\Theta$, which will be described below. The Monte Carlo selection of an alignment shift begins at step 160 in FIG. 4. In step 140, a cross-correlation function $E_i(\tau)$ is retrieved.

Next, in step 160, a probability distribution function $pdf(\tau)$ is determined in accordance with Equation (2):

$$pdf(\tau) = \exp\left[-\frac{1}{2}\left(\frac{\tau - \tau_i^{model}}{\Theta}\right)^2\right] \cdot \exp\left[-\frac{E_i(\tau)}{T}\right] \quad \text{Equation (2)}$$

for $\tau \in [\tau_1, \tau_2]$, where $\tau_1$ and $\tau_2$ are predetermined limits on the shifts. FIG. 5B shows an exemplary sketch of the probability distribution function $pdf(\tau)$. The function shown by Equation (2) is the unnormalized probability of choosing the time shift value $\tau$ to align the $i^{th}$ trace pair during the current iteration of simulated annealing. The value $\tau_i^{model}$ is the time shift calculated by integrating the slowness changes along the ray path. This "slowness" includes updates to the model slowness changes that have accumulated during earlier iterations of the inversion process. The parameter $\Theta$ is a current time interval parameter, and T is a current numerical temperature parameter. As the velocity model is updated, the parameters $\Theta$ and T will be decreased during an iterative numerical cooling process, step 360 in FIG. 4, that is described below.

Referring still to FIG. 4, in step 180) a cumulative distribution function cdf(τ) is calculated over the interval τ∈[τ₁,τ₂] via Equation (3):

$$cdf(\tau) = \int_{\tau_1}^{\tau} pdf(\tau)d\tau / \int_{\tau_1}^{\tau_2} pdf(\tau)d\tau. \quad \text{Equation (3)}$$

FIG. 5C shows an exemplary sketch of the cumulative distribution function cdf(τ). Notice that the values of cdf(τ) range from 0 to 1 and do not decrease with increasing τ. At step 200, a uniform random number R is generated within the interval [0,1]. The value of $\tau_i$ is determined in step 220 such that $$cdf(\tau_i) = R. \quad \text{Equation (4)}$$

Figure 6:
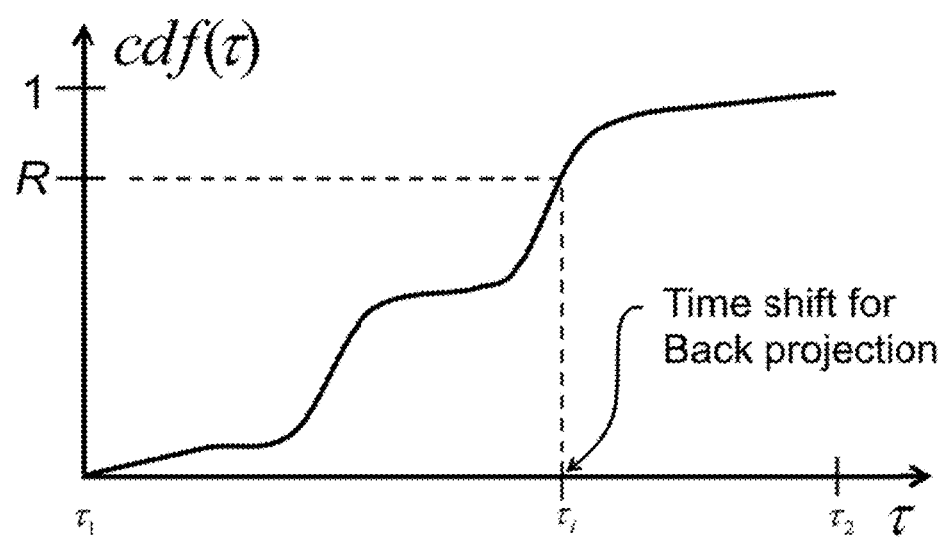
FIG. 6 is a cummulative distribution function with an exemplary random number R generated to find a time shift in accordance with Equation (4).

FIG. 6 shows an exemplary random number R generated to find a time shift by Equation (4). This value of $\tau_i$ is used at step 240 to compute velocity corrections by a method of back projection, for example as disclosed in U.S. Pat. No. 9,013,956. The back projection is sketched in FIG. 7a. Note, changes in slowness are distributed within the velocity model cells penetrated by the $i^{th}$ ray. The value $\Delta s_j^i$ is the slowness change in the $j^{th}$ cell computed from the $i^{th}$ ray. This distribution is made such that the slowness changes are smoothly varying along the raypath and such that the changes will cause a total traveltime change that is equal to $\tau_i$. Interpretive judgments are often made to only allow slowness updates in limited regions of the velocity model. For example, it might be believed that velocities are most uncertain near faults. In this case the velocity model might be masked to only allow updates near theses fault. In this case, slowness changes along the raypath would only be allowed where the path passed through a masked region of the model.

Figure 7:
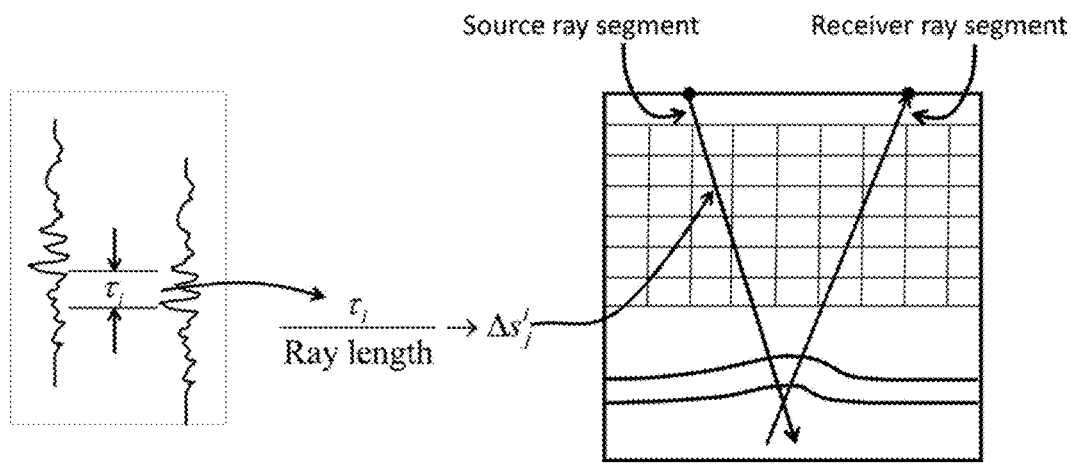
FIGS. 7A-B, respectively, are graphical representations of: (A) a slowness change is distributed smoothly along cells pierced by the raypath, such that the travel time change is equal to $\tau_i$; and (B) a travel time change in a cell is computed as a weighted average of the contributions from all the rays passing through the cell.
Figure 7:
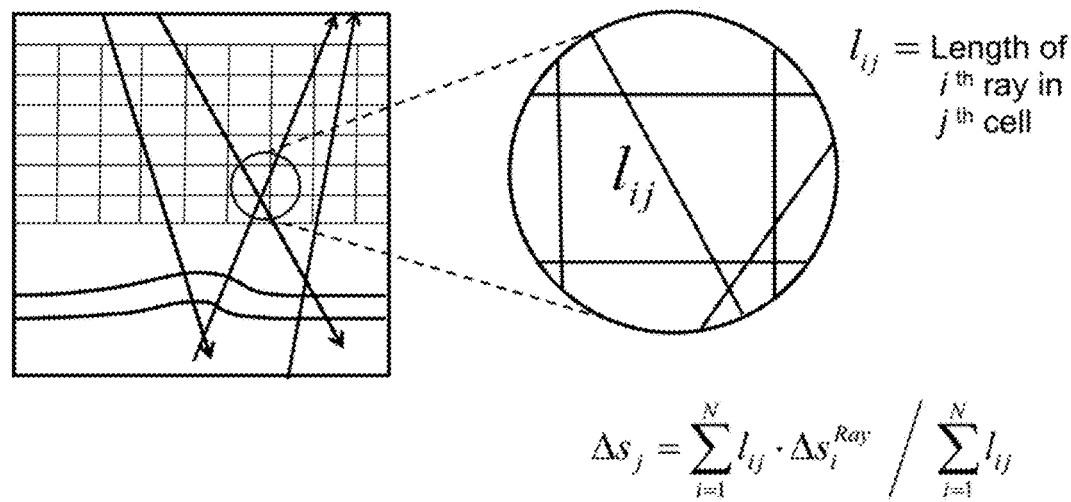

Referring back to FIG. 4, if there are more beam pairs to process at step 260, then the next pair is selected, and the method returns to computing the next probability distribution function at step 160. If there are no more beam pairs, however, then the method proceeds to step 320, where a weighted average sum is computed for the slowness changes accumulated for all beam of the beams. Most often, the weights are simply the lengths of the raypaths in the cells as shown in FIG. 7B. The weighted average sum for the slowness change in the $j^{th}$ cell is determined in accordance with Equation (5):

$$\Delta s_j = \sum_{i=1}^{N} l_{ij} \cdot \Delta s_j^i / \sum_{i=1}^{N} l_{ij}, \quad \text{Equation (5)}$$

where $l_{ij}$ is the length of the $i^{th}$ ray in the $j^{th}$ cell. The value of N is the total number of beam pairs. The slowness change is used to compute a velocity change. When the velocity values in the cells are updated, however, the changes are heavily damped at step 340 in accordance with Equation (6):

$$V_j \rightarrow V_j + \alpha \cdot \Delta V_j. \quad \text{Equation (6)}$$

The corrections are typically damped by a factor of a that is in the range 0.05 to 0.1, before they are added into the velocity model for the following iteration. This severe damping allows only small changes to the velocity update during each iteration, but is not inefficient because many iterations will be used during a simulated annealing cooling process.

Next, at step 360, both the numerical temperature T and the time Θ interval are decreased. In one embodiment, the values of T and Θ are each decreased by multiplicative factors $A_T$ and $A_\Theta$ that are slightly less than unity and remain the same throughout the iterations of the process. The value of T is typically very large for the first iteration, such that probability distribution function pdf(τ) initially does not greatly depend on the cross correlation $E_i(\tau)$ as shown for example in FIG. 8(A). With this large initial value of T, the cumulative distribution function cdf(τ) increases smoothly (see FIG. 8B) which means all values of τ within the range τ∈[τ₁, τ₂] will be selected with nearly equal probability. Consequently, the value of τ selected by the Monte Carlo process will be almost uniformly distributed the interval [τ₁, τ₂].

Figure 9:
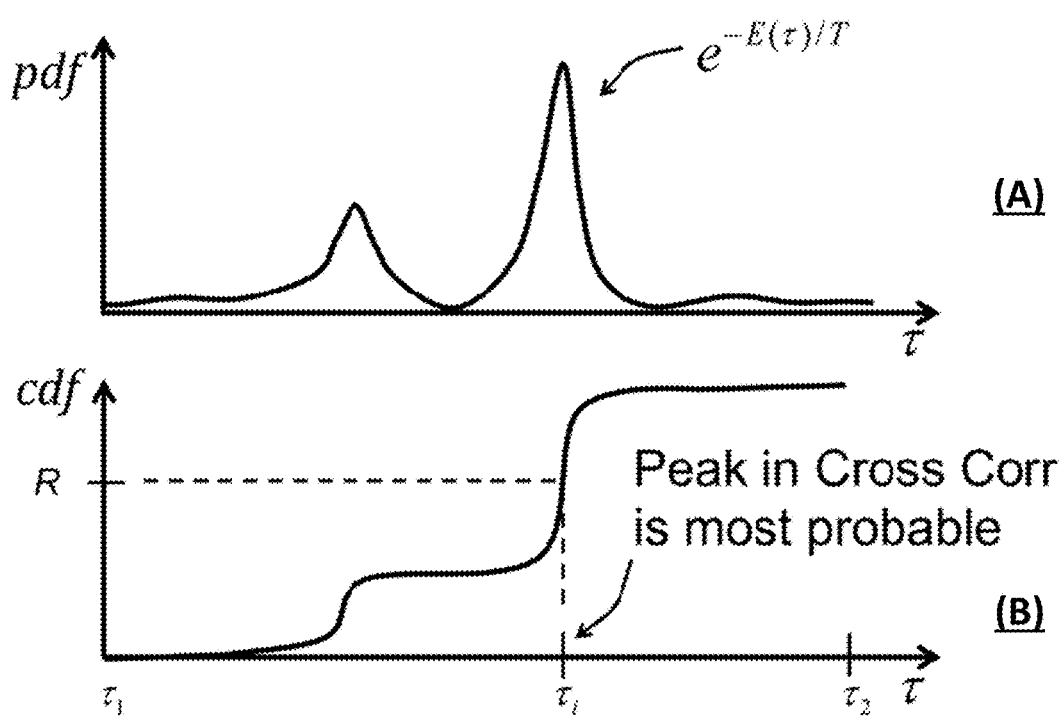
FIGS. 9A and 9B, respectively, are graphical representations of: (A) a probability distribution function corresponding to Equation (2) at low temperature; and (B) a cummulative distribution function corresponding to Equation (3) at low temperature.

However, as T is reduced during the iterative process, the shifts with large cross-correlation will be much more probable than those with small cross-correlation, as is shown for example in FIG. 9A. Once temperature becomes small, the cumulative distribution function cdf(τ) will have distinct steps (see FIG. 9B), which occur at the peaks in pdf(τ). In this case, the value of $\tau_i$ that satisfies Equation (4) is most likely to occur at a peak in the probability distribution function pdf(τ). Thus, at low temperature, the probability distribution function is strongly peaked about the local maxima in the cross-correlation function. These peaks cause distinct steps in the cummulative distribution function. The Monte Carlo process is likely to select $\tau_i$ near the peaks in cross correlation.

Figure 8:
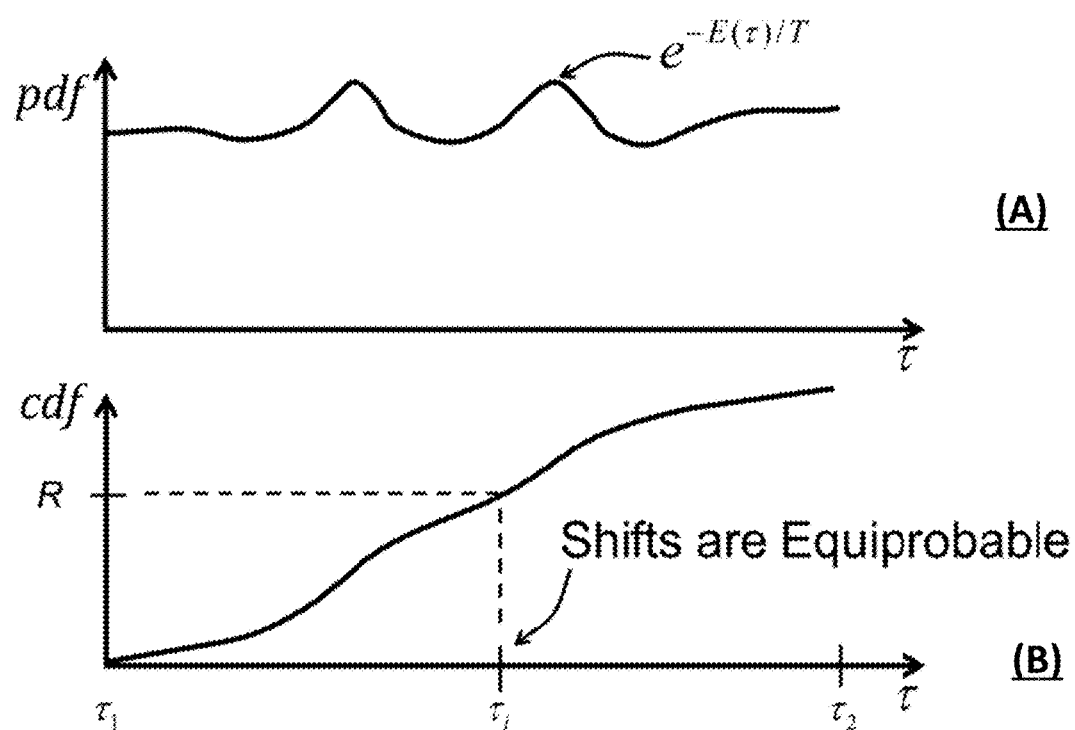
FIGS. 8A and 8B, respectively, are graphical representations of: (A) a probability distribution function corresponding to Equation (2) at high temperature; and (B) a cummulative distribution function corresponding to Equation (3) at high temperature.
Figure 10:
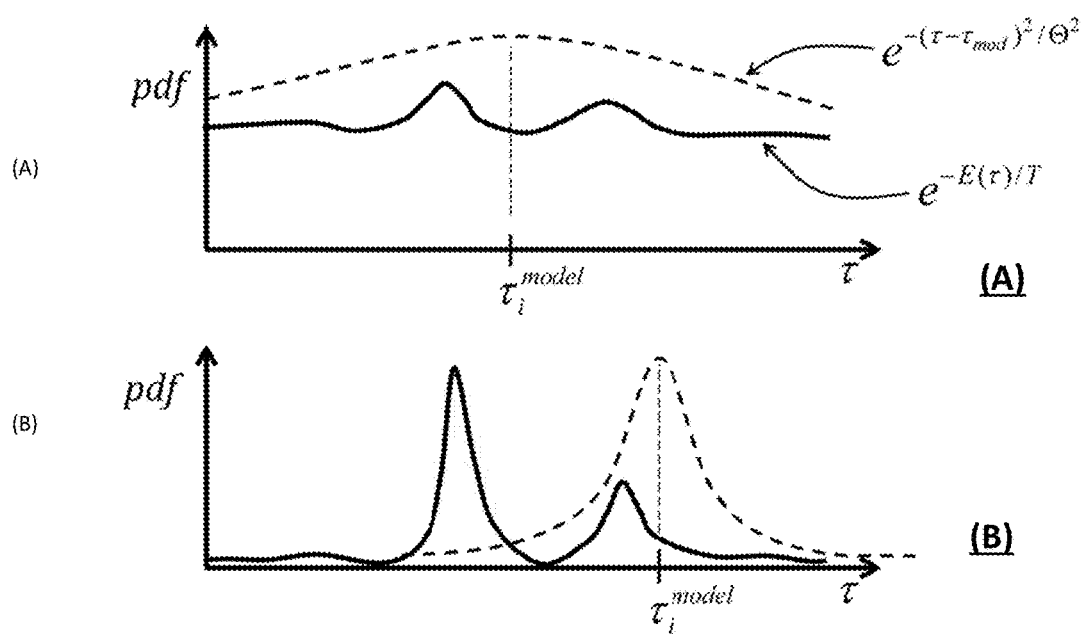

The initial value of the temperature T is chosen so that the probability distribution function has no narrow peaks as shown for example in FIG. 8(A). The final temperature is chosen low enough that there are distinct peaks as shown in FIG. 9(A), but not so low that only one peak dominates. The initial value of the time interval Θ is chosen wider than several cycles of the cross-correlation function, yielding a probability distribution function as shown in FIG. 10(A). The final value of Θ is usually slightly less than a typical cycle of the cross-correlation so as to yield a probability distribution function as shown in FIG. 10(B). If the iterations of the Monte Carlo process are progressing toward a good estimate of velocity model, then the value $\tau_i^{model}$ should be nearly correct at later iterations. Then the as Θ becomes small, the first factor on the right-hand side of Equation (2) will suppress large values of probability that are far from the currently modeled travel time $\tau_i^{model}$, which presumes that these distant peaks are caused by cycle skips or by spurious alignments with coherent noise, such as multiply reflected events. In summary, the initial value of Θ is chosen to be large enough so as to avoid bias against any of the maxima in cross-correlation. As the iterations proceed, the value of Θ is reduced, because peaks that are distant from the time shift $\tau_i^{model}$ are likely to be artifacts such as cycle skips or spurious alignments with coherent noise. The multiplicative factors $A_T$ and $A_\Theta$ are given values that result in T and Θ changing from predetermined initial values to predetermined final values in a predetermined number of iterations.

For the current invention, the update of the image is done infrequently in an outer loop of the process, for example as shown by step 18 FIG. 3. Alternatively, however, the performance of the process can be improved by moving the imaging step to an inner loop. For example, the steps 18 to 24 could be moved from the outer loop in FIG. 3 and inserted as an inner loop between step 340 and 360 in FIG. 4.

Alternatively, the current travel-time based alignment methods can be generalized to include waveform matching methods (Ribodetti, et al., 2011).

Figure 11:
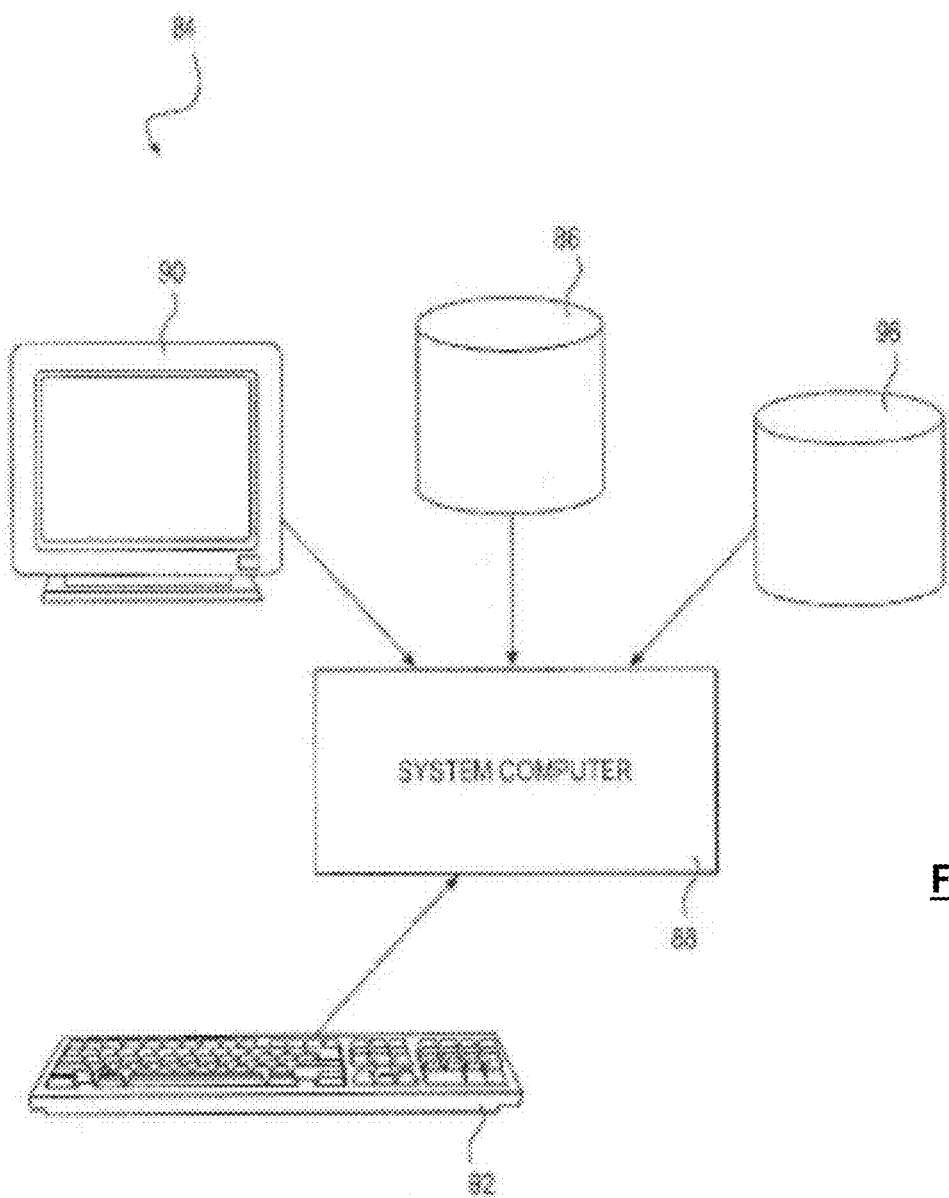
FIG. 11 is a schematic diagram of a system in accordance with the present invention.

FIG. 11 schematically illustrates an example of a computer network 84, into which implementations of various embodiments described herein may be implemented. The computer network 84 may include a data processing system or computer system 88, which may be implemented as any conventional personal computer or server. However, those skilled in the art will appreciate that implementations of various technologies described herein may be practiced in other computer system configurations, including hypertext transfer protocol (HTTP) servers, hand-held devices, multiprocessor systems, microprocessor-based or programmable consumer electronics, network PCs, minicomputers, Linux computers, mainframe computers, and the like.

The computer system 88, comprising at least one processor, may be in communication with computer storage media, for example, disk storage or memory devices 86 and 96, which may be external hard disk storage devices. It is contemplated that disk storage devices 86 and 96 are conventional hard disk drives, and as such, will be implemented by way of a local area network or by remote access. Of course, while disk storage devices 86 and 96 are illustrated as separate devices, a single disk storage device may be used to store any and all of the program instructions, measurement data, and results as desired.

In one implementation, data related to the subsurface region of interest may be stored as computer storage media in disk storage device 96. The computer system 88 may retrieve the appropriate data from the disk storage device 96 to process the data according to program instructions that correspond to implementations of various technologies described herein. The program instructions may be written in a computer programming language, such as C++, Java and the like. The program instructions may be stored in a computer readable medium, such as program disk storage device 86. Such computer-readable media may include computer storage media and communication media. Computer storage media may include volatile and non volatile, and removable and non-removable media implemented in any method or technology for storage of information, such as computer readable instructions, seismic data, structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the computing system 88. Communication media may embody computer readable instructions, data structures, program modules or other data in a modulated data signal, such as a carrier wave or other transport mechanism and may include any information delivery media. The term "modulated data signal" may mean a signal that has one or more of its characteristics set or changed in such a manner as to encode information in the signal. By way of example, and not limitation, communication media may include wired media such as a wired network or direct-wired connection, and wireless media such as acoustic, RF, infrared and other wireless media. Combinations of the any of the above may also be included within the scope of computer readable media In one implementation, the computer system 88 may include graphical user interface (GUI) components such as a graphics display 90 and a keyboard 92 which can include a pointing device (e.g., a mouse, trackball, or the like, not shown) to enable interactive operation. The GUI components may be used both to display data and processed data products and to allow the user to select among options for implementing aspects of the method. The computer system 88 may store the results of the methods described above on disk storage 86, for later use and further analysis.

The computer system 88 may be located at a data center remote from the data acquisition region or processing facility (not shown). The computer system 88 may be in communication with the data acquisition receivers (either directly or via a recording unit, not shown), to receive signals indicative of the geophysical properties of the subsurface region of interest. These signals, after conventional formatting and other initial processing may be stored by the computer system 88 as digital data in the disk storage 96 for subsequent retrieval and processing in the manner described above. While FIG. 19 illustrates the disk storage 96 as directly connected to the computer system 88, it is also contemplated that the disk storage device 96 may be accessible through a local area network or by remote access. Furthermore, while disk storage devices 86 and 96 are illustrated as separate devices for storing input data and analysis results, the disk storage devices 86 and 96 may be implemented within a single disk drive (either together with or separately), or in any other conventional manner as will be fully understood by one of skill in the art having reference to this specification.

Notwithstanding that the present invention has been described above in terms of alternative embodiments, it is anticipated that still other alterations, modifications and applications will become apparent to those skilled in the art after having read this disclosure. For example, it is to be understood that the present invention contemplates that, to the extent possible, one or more features of any embodiment can be combined with one or more features of any other embodiment. It is therefore intended that such disclosure be considered illustrative and not limiting, and that the appended claims be interpreted to include all such applications, alterations, modifications and embodiments as fall within the true spirit and scope of the invention.

What is claimed is:

1. A method for generating an updated seismic image for hydrocarbon reservoir exploration and development that reduces artifacts, the updated seismic image being based on a data beam set derived from recorded seismic data and a modeled beam set derived at least in part from a velocity model related to a subsurface region and a seismic image, the method being performed by a computer system including electronic storage that stores the data beam set, the velocity model, and the seismic image, one or more physical processors configured by machine-readable instructions, and a physical display, the method comprising:
    determining, with the one or more physical processors, a cross-correlation function between the modeled beam set and data beam set over a predetermined range of time shifts;
    updating, with the one or more physical processors, the velocity model by performing a Monte Carlo inversion including a back-projection and a global minimization, wherein the Monte Carlo inversion minimizes effects of cycle skipping in beam alignment and spurious alignments due to coherent noise, and wherein performing the Monte Carlo inversion comprises:
        determining, with the one or more physical processors, a probability distribution function of the predetermined range of time shifts using the cross-correlation function;

determining, with the one or more physical processors, a cumulative distribution function over the predetermined range of time shifts using the probability distribution function;

generating, with the one or more physical processors, a random number within a predetermined interval;

selecting, with the one or more physical processors, a time shift value from the predetermined range of time shifts such that the randomly generated number is equal to the cumulative distribution function; and determining, with the one or more physical processors, a velocity correction for the velocity model to generate an updated velocity model using the time shift value;

generating, with the one or more physical processors, the updated seismic image by migrating the data beam set using the updated velocity model of the subsurface region; and effectuating presentation of the updated seismic image generated via a graphical user interface on the physical display.

2. The method of claim 1, wherein using the time shift value to determine a velocity correction is done by the back-projection.

3. The method of claim 1, further comprising:
determining, with the one or more physical processors, a slowness change, wherein the slowness change is used to determine the velocity correction.

4. The method of claim 1, wherein the global minimization is simulated annealing.

5. A method for generating an updated seismic image of a subsurface region of interest for hydrocarbon reservoir exploration and development that reduces artifacts, the method being performed by a computer system including a non-transitory computer storage media, one or more physical processors configured by machine-readable instructions, and a physical display, the method comprising:

storing in the non-transitory computer storage media, a data beam set generated from recorded seismic data that samples a portion of the subsurface region of interest;

migrating, with the one or more physical processors, the data beam set, comprising a plurality of data beams, and an initial earth model, having an initial velocity model representative of the subsurface region of interest, to generate a seismic image of the subsurface region of interest;

deriving, with the one or more physical processors, a modeled beam set from the seismic image and the initial earth model;

cross-correlating, with the one or more physical processors, a modeled beam from the modeled beam set with a corresponding data beam within the data beam set;

storing in the non-transitory computer storage media beam pairs of cross-correlated modeled beams and data beams that, for a measured time shift, have a cross-correlation value that exceeds a determined threshold, and repeating the cross-correlated and storing operations until a determined number of corresponding data beams have been modeled;

generating, with the one or more physical processors, an updated earth model of the subsurface region of interest having an updated velocity model by performing a Monte Carlo inversion of the measured time shifts, wherein performing the Monte Carlo inversion comprises:

determining, with the one or more physical processors, a cross-correlation function between the modeled beam set and data beam set over a predetermined range of time shifts;

determining, with the one or more physical processors, a probability distribution function of the predetermined range of time shifts using the cross-correlation function;

determining, with the one or more physical processors, a cumulative distribution function over the predetermined range of time shifts using the probability distribution function;

generating, with the one or more physical processors, a random number within a predetermined interval;

selecting, with the one or more physical processors, a time shift value from the predetermined range of time shifts such that the randomly generated number is equal to the cumulative distribution function; and determining, with the one or more physical processors, a velocity correction for the initial velocity model to generate the updated velocity model;

generating, with the one or more physical processors, the updated seismic image via migrating the updated earth model of the subsurface region of interest and the data beam set, the updated seismic image characterizing the propagation of the data beams through the subsurface region of interest; and effectuating presentation of the updated seismic image generated via a graphical user interface on the physical display.

* * * * *